US012628084B2

(12) United States Patent

Ghazal

(10) Patent No.: US 12,628,084 B2

(45) Date of Patent: May 12, 2026

(54) ADAPTIVE, POWER-EFFICIENT TRANSMITTER CONTROL FOR BATTERY-POWERED WIRELESS SENSORS

(71) Applicant: Oryx Holdings, Grand Cayman (KY)

(72) Inventor: Obieda M.A.K. Ghazal, Amman (JO)

(73) Assignee: Oryx Holdings, Grand Cayman (KY)

( * ) Notice: Subject to any disclaimer, the term of this patent is extended or adjusted under 35 U.S.C. 154(b) by 365 days.

(21) Appl. No.: 18/419,859

(22) Filed: Jan. 23, 2024

(65) Prior Publication Data

US 2025/0240731 A1 Jul. 24, 2025

(51) Int. Cl.
*H04W 52/02* (2009.01)
*H03M 1/12* (2006.01)

(52) U.S. Cl.
CPC ....... *H04W 52/0274* (2013.01); *H03M 1/124* (2013.01)

(58) Field of Classification Search
CPC .......... H04W 52/0274; H04W 52/0225; H04B 5/73; H04B 1/1615; H04B 7/0693; H04B 7/0877; H04B 1/40; H03M 1/124
See application file for complete search history.

(56) References Cited

U.S. PATENT DOCUMENTS

| | | | |
|---|---|---|---|
| 8,723,525 B2 | 5/2014 | Stits et al. | |
| 8,971,225 B2 | 3/2015 | Seok et al. | |

| | | | |
|---|---|---|---|
| 9,496,887 | B1 * | 11/2016 | Quiquempoix ......... H03M 1/34 |
| 9,984,691 | B2 * | 5/2018 | Wiesbauer ........... H04R 29/004 |
| 10,735,683 | B1 * | 8/2020 | Kozlowski ........... H04N 25/616 |
| 11,647,459 | B2 * | 5/2023 | Islam ................ H04W 52/0212 370/311 |
| 12,379,736 | B1 * | 8/2025 | Guo .......................... G05F 1/56 |
| 2007/0223626 | A1 * | 9/2007 | Waxman ........... H04W 52/0245 375/316 |
| 2011/0043393 | A1 * | 2/2011 | Tamura ............... H03M 1/1038 341/118 |
| 2015/0268760 | A1 * | 9/2015 | Park ...................... G06F 3/0446 345/174 |
| 2020/0068492 | A1 * | 2/2020 | Lee ...................... H04B 17/318 |
| 2022/0286884 | A1 | 9/2022 | Futaki et al. |
| 2025/0112639 | A1 * | 4/2025 | Han ........................ H03M 1/16 |

* cited by examiner

*Primary Examiner* — Andrew Wendell

(74) *Attorney, Agent, or Firm* — Christine Johnson; Abhijit Sadananda

(57) ABSTRACT

The disclosure provides an apparatus and method that conserves battery power in a battery-operated wireless sensor. A first sample and at least a subsequent second sample is obtained of an analog signal whose magnitude varies over time in accordance with variations over time in a process parameter. The magnitude of the first sample is mapped to a first digital value, and the magnitude of the subsequent second sample is mapped to a second digital value in accordance with an ADC quantization scheme. The first digital value to mapped to a first level, and the second digital value is mapped to a second level in accordance with a digital quantization scheme. The second digital value is transmitted only when the second level differs from the first level.

19 Claims, 9 Drawing Sheets

ADAPTIVE, POWER-EFFICIENT TRANSMITTER CONTROL FOR BATTERY-POWERED WIRELESS SENSORS

TECHNICAL FIELD

The disclosure relates in general to wireless sensors, and more particularly to battery-powered wireless sensors employing radio frequency (RF) transmitters to communicate sensor data.

BACKGROUND

Wireless sensors include radio frequency (RF) transmitters to communicate sensor data via an air medium. RF transmitters include power amplifiers to boost the RF signal conveying the sensor data to a power level sufficient for effective transmission through the air medium. Power amplifiers consume considerable power in their active states. Wireless sensors may be battery powered. Battery-powered wireless sensors are portable, simple to install and cost effective. They can be deployed in remote or mobile environments that lack constant access to an external power source. However, meeting the power demands of RF transmitters with the limited energy storage capacity of batteries without sacrificing operational capability of the sensor poses a significant technical challenge.

BRIEF DESCRIPTION OF THE DRAWINGS

Embodiments are illustrated by way of example and not limitation in the features of the accompanying drawings in which like numerals indicate like elements.

DETAILED DESCRIPTION OF THE DRAWINGS

FIG. 1

Figure 1:
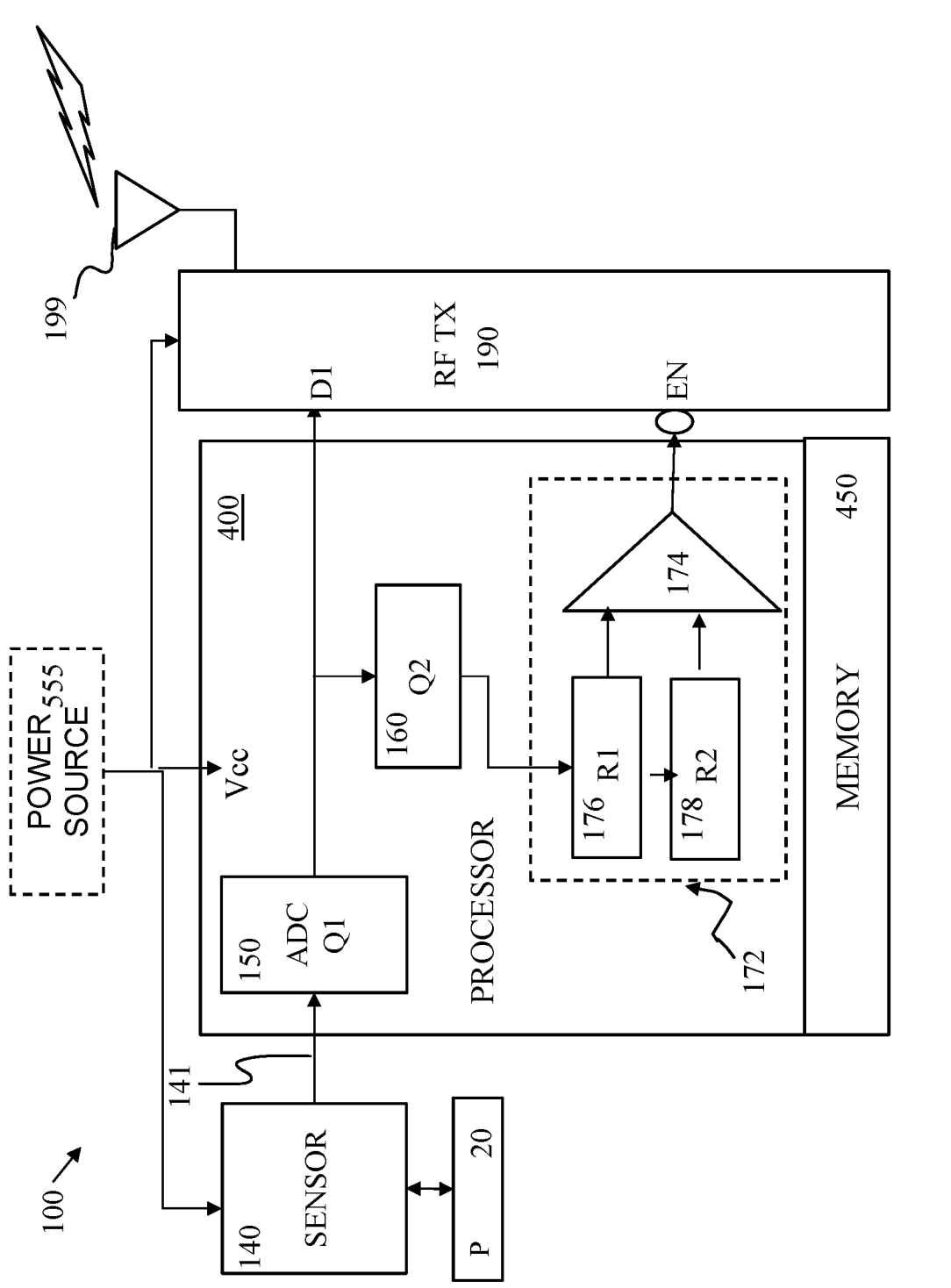
FIG. 1 is a block diagram of an example adaptive, energy-efficient wireless sensor apparatus.

FIG. 1 is a block diagram of an example wireless sensor apparatus 100. Apparatus 100 is shown to comprise a sensor 140, an analog to digital converter (ADC) 150, a digital quantizer 160, a detector circuit 172 and a radio frequency (RF) transmitter 190 including an antenna 199. In the example implementation of FIG. 1, ADC 150, digital quantizer 160 and detector circuit 172 are integrated, i.e., implemented using one or more integrated circuits (IC) comprising a processor 400. Sensor 140, processor 400 and RF transmitter 190 are configured to cooperate to transmit sample data provided by sensor data 140 through antenna 199 and into an air medium to a compatible RF receiver (not shown).

In a processor implementation, the components and circuits shown in FIG. 1 may be implemented by lower-level structural components and circuits comprising processor 400. Examples of lower-level components include counters, registers, memory cells and other storage elements, as well as logic gates, logic circuits, clocks and other digital circuitry. In those implementations, memory 450 stores processor-executable instructions by which processor 400 manipulates the lower-level components to perform the functions described herein in terms of the higher-level components shown in the block diagrams.

As shown in FIG. 1, sensor 140, processor 400 and RF transmitter 190 can be supplied with operating power by a power source 555. In battery-powered implementations of apparatus 100, power source 555 may comprise one or more batteries. In mains-powered implementations, power source 555 may be component such as an AC/DC converter supplying DC power derived from a mains power source.

In one example implementation, processor 400 comprises a system on a chip (SoC). In that implementation, RF transmitter 190 is provided on the SoC in a cooperative arrangement with a micro control unit (MCU) also provided on the SoC. An example of a suitable, commercially available SoC is the ESP32 Series SoC made by Espressif Systems of Shanghai, China and available from amazon, eBay, AliExpress and other online retailers as well as from many local electronics stores.

In general, Sensor 140 is configured to sense a parameter P of a process 20 and to provide an analog signal 141 whose magnitude varies over time in accordance with variations in parameter P over time. Examples of analog sensors within the scope of the disclosure include, but are not limited to temperature sensors, load sensors, force sensors, charge sensors and the like.

Sensor 140 provides analog signal 141 to ADC 150. ADC 150 is configured to obtain respective samples of analog signal 141. ADC 150 measures the magnitudes of the respective samples, e.g., in terms of charge as a percentage of a specified voltage range. A measurement of an analog signal magnitude could in theory be expressed with infinite precision. In practice the precision is limited by the number of bits available to the ADC. to represent the measurement as a digital value.

To represent the sample magnitudes by digital values within its limited symbol capacity, ADC 150 includes an ADC quantizer component (indicated as Q1). A quantizer is a component that divides a specified voltage range over which the magnitude of an analog signal can vary with infinite precision, into a number of segments (called 'bins') the ADC is capable of representing as a digital value given the limited number of bits available to the ADC. Every possible measured value of the analog signal within the specified range will necessarily fall into one of these 'bins'. The ADC maps measured values to corresponding bins and represents all values mapped to the same bin with digital value assigned to that bin. Thus, there can be many different measured values to which the ADC will assign the same digital value.

Table 1 below shows a simplified example three-bit ADC quantization scheme that provides 8 bins (as shown in column 2) to represent all possible sample magnitudes between 0V and 3V as shown in column 1. The range of values falling into the same bin is defined by a lower limit value, (e.g., 0 for bin 0) and an upper limit value (e.g., 0.375 for bin 0) as shown in column 1.

TABLE 1

| TABLE 1 ADC QUANTIZATION SCHEME | | |
|---|---|---|
| ADC INPUT | BIN | ADC Output 'Bin label' - Digital Value |
| 0-.375 | 0 | 000 |
| .375-.75 | 1 | 001 |
| .75-1.125 | 2 | 010 |
| 1.125--1.5 | 3 | 011 |
| 1.5-1.875 | 4 | 100 |
| 1.875-2.25 | 5 | 101 |
| 2.25-2.625 | 6 | 110 |
| 2.625-3 | 7 | 111 |

Table 2, shows a hypothetical example of seven consecutive samples of analog signal 141. Column 1 indicates the time order of the samples. Column 2 shows the magnitude of each sample. Column 3 shows the digital value representing the bin into which ADC 150 mapped the corresponding sample magnitude in accordance with the example ADC quantization scheme illustrated in Table 1.

TABLE 2

| TABLE 2 SEQUENCE OF SAMPLES | | |
|---|---|---|
| Sample Time | Sample Magnitude (Volts) | ADC Digital Value |
| t = 0 | 2.99 | 111 |
| t = 1 | 2.63 | 111 |
| t = 2 | 2.62 | 110 |
| t = 3 | 2.26 | 110 |
| t = 4 | 1.6 | 100 |
| t = 5 | 0.374 | 000 |
| t = 6 | 1.88 | 101 |

As shown in Table 2, at t=1 ADC 150 obtains a first sample of analog signal 141. ADC 150 measures the magnitude of the first sample charge as 2.99V. Thus, according to the quantization scheme of Table 1, the magnitude of the first sample falls in bin 7. The unique digital value assigned to bin 7 is 111. Accordingly, ADC 150 provides 111 as the digital value representing the magnitude of the first sample. At t=2, ADC 150 obtains a second sample. ADC 150 measures the magnitude of the second sample as 2.63V. According to the quantization scheme of Table 1, this magnitude also belongs in bin 7. Thus, ADC 150 outputs 111 as the second digital value. Here, the magnitude of the second sample is different from the magnitude of the first sample. However, the output of ADC 150 is the same for both samples because both values fall into the same bin according to the example ADC quantization scheme.

At t=3 ADC 150 obtains a third sample. The measured magnitude of the third sample is 2.62V, which corresponds to bin 6. Accordingly, ADC 150 outputs the digital value 110 to represent the magnitude of the third sample. This process of 'binning' a sample and providing the digital value corresponding to the bin continues in the same manner for the remaining samples.

Referring to the example apparatus shown in FIG. 1, ADC 150 provides respective digital values to RF transmitter 190. However, to transmit the digital value, transmitter 190 must be in an active state as explained in further detail with respect to FIG. 2.

ADC 150 also provides the respective digital values to digital-to-digital quantizer 160 (Q2). Digital-to-digital quantizer 160 is configured to divide the number of unique digital values (bin labels) available to ADC 150 into a predetermined number of levels (also referred to as bins). The number of levels can be any number greater than 1, but less than the number of different unique digital values that can be provided by ADC 150.

Like ADC quantizer Q1, digital-to-digital quantizer 160 (Q2) assigns to respective levels, corresponding respective unique labels. In the example above, ADC 150 can provide a maximum of 8 different unique digital values. In an example implementation of quantizer Q2, the number of levels is 4. This number of unique digital values and the number of levels define a digital quantization scheme for digital-to-digital quantizer 160. In the example digital quantization scheme a level will have a width that encompasses two different unique digital values of the 8 possible different unique values that can be provided by ADC 150.

Table 3 illustrates this example digital quantization scheme.

TABLE 3

| TABLE 3 DIGITAL QUANTIZATION SCHEME | |
|---|---|
| ADC digital value | Quantization level |
| 000 | 1 |
| 001 | 1 |
| 010 | 2 |
| 011 | 2 |
| 100 | 3 |
| 101 | 3 |
| 110 | 4 |
| 111 | 4 |

Table 4 shows the ADC quantization scheme of Table 2 combined with the digital quantization scheme shown in Table 3 to provide a complete mapping from a sample magnitude to a quantization level.

TABLE 4

| TABLE 4 ADC AND DIGITAL QUANTIZATION SCHEMES | | | |
|---|---|---|---|
| COL 1 BIN | COL 2 ADC INPUT PORTION (0 V - 3 V) | COL. 3 ADC Output 0VDC-3VDC Resolution - 3 bits | COL. 4 Q2 Output (4 LEVELS) |
| 1 | 0-.375 | 000 | 1 |
| 2 | .375-.75 | 001 | 1 |
| 3 | .75-1.125 | 010 | 2 |
| 4 | 1.125--1.5 | 011 | 2 |
| 5 | 1.5-1.875 | 100 | 3 |
| 6 | 1.875-2.25 | 101 | 3 |
| 7 | 2.25-2.625 | 110 | 4 |
| 8 | 2.625-3 | 111 | 4 |

Table 5
Table 5 Example Sequence of Samples

Table 5 shows the hypothetical sample sequence of Table 2, with sample time sequence in col. 1, sample magnitude in col. 2, corresponding ADC digital value in col. 4 and corresponding digital quantization level in col. 6. Col. 3 shows changes in magnitudes from the magnitude of the previous sample to the magnitude of the subject sample.

TABLE 5

| COL 1 Sample Time | COL 2 Sample Magnitude (Volts) | COL 3 Change | COL 4 ADC Digital Value | COL 5 Change | COL 6 Q2 LEVEL |
|---|---|---|---|---|---|
| t = 0 | 2.99 | | 111 | | 4 |
| t = 1 | 2.63 | .36 | 111 | 0 | 4 |
| t = 2 | 2.62 | .01 | 110 | 1 | 4 |
| t = 3 | 2.26 | 0.36 | 110 | 0 | 4 |
| t = 4 | 1.6 | .66 | 100 | 2 | 3 |
| t = 5 | 0.374 | 1.226 | 000 x | 4 | 1 |
| t = 6 | 1.88 | 1.506 | 101 | 5 | 3 |

With reference to FIG. 1, it can be seen for respective digital values (shown in col. 4), digital-to-digital quantizer 160 is configured to provide corresponding, respective first levels (shown in col. 6) to detector circuit 172. For example, a first sample of analog signal 141 obtained at t=0 has a magnitude of 2.99 V. ADC 150 maps the magnitude of the first sample to a first digital value, which is '111' shown in col. 4, according to the ADC quantization scheme shown in Table 1. ADC 150 applies the first digital value to the D1 input of transmitter 190 and also to digital quantizer 160.

Digital quantizer 160 maps the first digital value '111' to a corresponding first level, which is '4' in the digital quantization scheme shown in Table 3. Quantizer 160 provides the level '4' to register R2 (178) of detector circuit 172.

At time t=1, a second sample of analog signal 141 is obtained by ADC 150. The second sample has a magnitude of 2.63 Volts. ADC 150 maps the magnitude of the second sample to a second digital value, which is also '111' according to the ADC quantization scheme of table 1. ADC 150 applies the second digital value '111' to D1 of transmitter 190 and also provides the second digital value 111 to quantizer 160. Quantizer 160 maps the second digital value (111) to a second level, which is '4' in the digital quantization scheme of Table 3. Quantizer 160 provides the level '4' to register R1 (176).

Detector circuit 172 compares the level in R2 to the level in R1. Comparator 174 of detector circuit 172 detects the first and second levels are the same. In response to detecting the first and second levels the same, comparator 174 sets its output bit to '0' and asserts '0' on the EN input of transmitter 190. This deactivates transmitter 190 if transmitter 190 was in an active state when '0' was asserted. If transmitter 190 was in the deactivated state (also referred to as 'idle', 'inactive' or 'off' state) when comparator 174 asserted '0' on the enable input, transmitter 190 remains the deactivated state. In the deactivated state, transmitter 190 does not transmit the digital value (in this case, 111) at its D1 input.

The above process repeats for samples obtained at t=2 and t=3 with no change in the level provided by digital quantizer 160. In other words, the level remains at 4 from t=0 to t=3, although the sample magnitudes are changing with each sample and the digital value provided by ADC 150 has changed once.

Detector circuit 172 includes a comparator 178. Comparator 178 is configured to compare the second level to the first level to determine whether or not the second level differs from the first level and to output a signal indicating results of the comparison. For example, comparator 178 may provide a signal bit that is set to '1' to indicate detection of the second level different from the first level, and a signal bit that is set to '0' to indicate detection of the second level the same as the first level.

Detector circuit 172 is configured to provide the output of comparator 178 (indicating the results of the comparison) to an 'enable' (EN) input of transmitter 190. In an example implementation, asserting a '1' on the EN input of transmitter 190 activates transmitter 190 to transmit the second digital value. In its activated state, transmitter 190 modulates data presented to its D1 input onto an RF carrier, boosts the power of the modulated RF carrier and transmits the boosted, modulated RF carrier through antenna 199 whereupon the boosted, modulated RF carrier propagates through the air medium.

RF transmitter 190 receives the output of detector circuit 172 as an 'enable' or 'activate' signal (or transmit command). RF transmitter 190 is further configured to transmit the digital data at its D1 input in response to receiving the 'enable' signal from comparator 178.

Every instance of RF transmitter 190 transmitting a digital value results in consumption of power from battery 40. Apparatus 100 is configured so that RF transmitter 190 transmits a digital value at its D1, D2 inputs only when a level changes, rather than transmitting the digital value of every sample, and rather than transmitting a digital value on each instance of the digital value changing from one sample to the next. For example, where process P1 does not change during a first-time interval, e.g., 1 minute, RF transmitter 190 will not be operated to transmit any value at its D1 input during that minute. This is because detector circuit 172 will not detect any level change within that minute. Thus, comparator 178 will not provide an 'enable' signal to transmitter 190 during that minute.

However, assume in the next minute the process parameter value changes value 10 times, and in two instances the value changes from a value within a first level to a value within different second level. In that case, transmitter 190 will be enabled to transmit twice. In that sense, the quantization scheme of Q2 allows sensor 140 to adapt its transmission rate to the particular characteristics of the process parameter it is sensing. Q2 optimizes the power efficiency of sensor 140 with respect to the particular process it senses. It allows the transmission scheme to adapt to the changing circumstances and characteristics in the absence of human intervention and with the sensor remaining online.

In that manner, apparatus 100 conserves power, and thus extends the duration of time over which battery 40 will supply power.

FIG. 2

Figure 2:
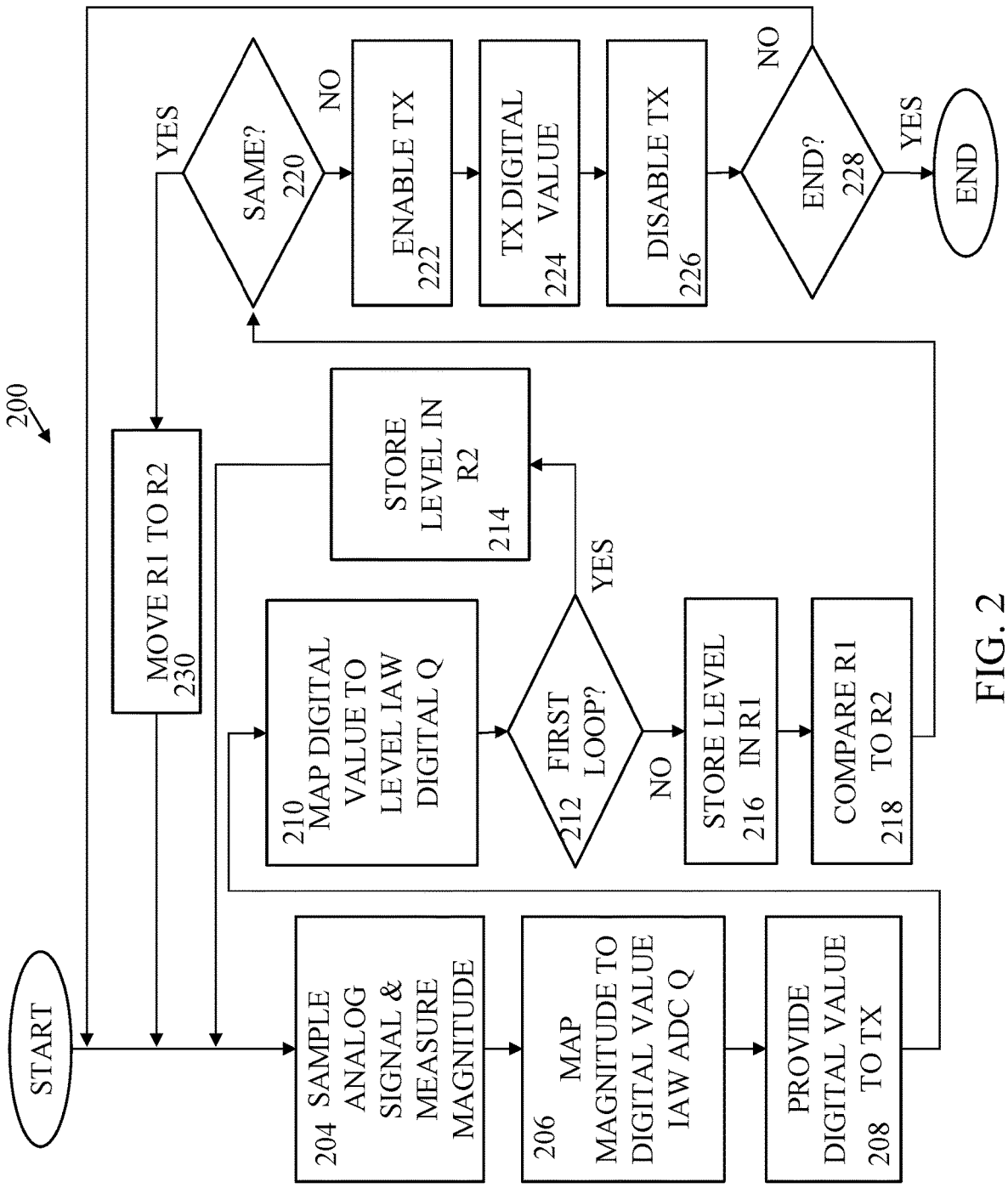
FIG. 2 is a flowchart of an example adaptive, energy-efficient method for controlling a transmitter of a wireless sensor apparatus.

FIG. 2 is a flow chart illustrating an example method 200 of conserving battery life in a battery-powered sensor such as sensor 140 shown in FIG. 1. At 204 ADC 150 obtains a first sample of the analog signal provided by sensor 140 and measures the magnitude of the first sample.

At 206 ADC 150 maps the measured magnitude of the first sample to a corresponding digital value in accordance with an ADC quantization scheme. Table 1 provides an example implementation of an ADC quantization scheme. In some example implementations, the ADC quantization scheme can be established by calibration of ADC 150 and/or configuration of ADC 150 in accordance with manufacturer's specifications.

At 208 ADC 150 provides the digital value to RF transmitter 190. At 210 digital-to-digital quantizer 160 maps the digital value to a corresponding first one of a predetermined number of possible levels in accordance with a digital quantization scheme as described above in the example shown in Table 3. In some example implementations, the number of possible levels may be predefined during an initial calibration of apparatus 100.

At 212 processor 400 determines whether the present pass (loop) through method 200 is the first pass (loop). If so, the level obtained at 210 is stored in a register R2 and the method returns to step 204. At step 204 processor 400 obtains and measures the magnitude of a second sample of analog signal 141; maps the magnitude to a second digital value in accordance with the ADC quantization scheme at 206, provides the second digital value to transmitter 190; and maps the second digital value to a second one of the predetermined number of possible levels in accordance with the digital quantization scheme.

At 212, processor 400 again determines whether this is the first loop (pass) through method 200. Since this pass is not the first pass (loop) the decision at 212 is 'no' and method proceeds to step 216. At 216 processor 400 stores the second level obtained at 210 in a register R1. At 218 processor 400 compares the level stored in R1 (on the second pass) with the level stored in R2 (on the first pass).

At 220 processor 400 compares the level stored in R2 to the level stored in R1. As a result of the comparison, processor 400 determines one of: the level stored in R2 is the same as the level store in R1, and the level stored in R2 is not the same as the level stored in R1. In the former case, the method proceeds to step 230 where processor 400 moves the level stored in R1 into R2, and proceeds to step 204. This replaces the level previously stored in R2.

In the latter case, i.e., 'no' the levels stored in R1 and R2 are not the same at step 220, processor 400 proceeds to step 222 wherein processor 400 enables transmitter 190. At step 224 transmitter 190 transmits the digital value provided to the transmitter at step 208.

At step 226, processor 400 deactivates transmitter 190 and no further digital values are transmitted until processor 400 once again enables transmitter 190. At step 228 processor 400 determines whether any termination conditions are met. If so, the method ends. If not, the method returns to step 204 and repeats.

FIG. 3

Figure 3:
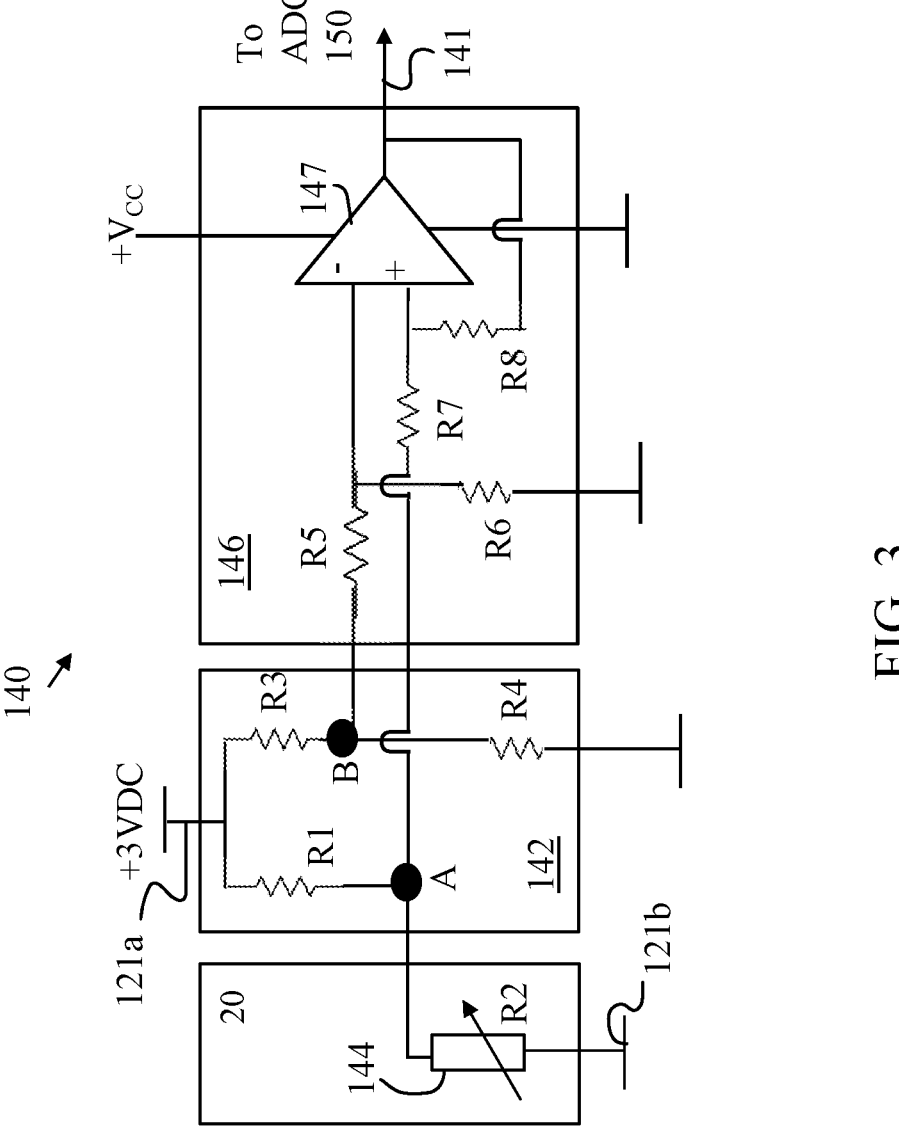
FIG. 3 is a schematic diagram of an example sensor component of the adaptive, energy-efficient wireless sensor apparatus shown in FIG. 1.

FIG. 3 is a schematic diagram of an example sensor 140 of apparatus 100 illustrated in FIG. 1. In the example of FIG. 3, sensor 140 comprises a sensor element 144, a Wheatstone bridge circuit 142 and an operational amplifier (OpAmp) circuit 146 including an operational amplifier 147. Wheatstone bridge circuit 142 includes four resistors R1, R2, R3 and R4 arranged to form a resistive bridge. Resistor R2 of Wheatstone bridge circuit 142 is sensor element 144.

Sensor element 144 has a resistance that varies in accordance with variations in a parameter of a process 20. Sensor element 144 may any type of analog sensor, e.g., temperature, load, weight, force, stress, strain, stretch or other type of sensor. The resistance of sensor element 144 changes in response to changes in a sensed parameter of process 20.

Terminals 121a, 121b of a DC voltage source such as battery 40 (illustrated in FIG. 1) are connected to corresponding power and ground terminals 121a, 121b respectively to supply Wheatsone bridge circuit 142 with operating power. The output of Wheatstone bridge circuit 142, which can be either voltage or current, is taken across a first point A at which resistor R1 meets sensor resistor R2, and a second point B at which R3 and R4 meet.

Initially, Wheatstone bridge circuit 142 is balanced, meaning that the ratio of the resistances of R1 and R2 is equal to the ratio of the resistances of R3 and R4. In the balanced state, the voltage across output terminals A and B is zero. When sensor element 144 experiences a change due to changes in the process parameter, the resistance of resistor R2 changes. This change unbalances Wheatstone bridge circuit 142. The unbalanced condition presents a non-zero potential difference across output terminals A and B. The difference in potential is proportional to the change in resistance of sensor element 144. The change in resistance is indicative of the change in the sensed parameter.

Wheatstone bridge circuit 142 is coupled to operational amplifier circuit 146. The output of operational amplifier 147 is analog signal 141. To generate analog signal 141, output terminal A is coupled to the non-inverting input of operational amplifier 147. Output terminal B is coupled to the inverting input of operational amplifier 147. Operational amplifier 147 amplifies the potential difference between point A and B produced by Wheatstone bridge circuit 142 in its unbalanced state. As the resistance of sensor 140 (R2) varies the potential difference between A and B varies and the signal at the output of operational amplifier circuit 146 varies in magnitude correspondingly. Operational amplifier circuit 146 further includes resistors R5, R6, R7 and R8 which are sized to amplify the potential difference within a range compatible with the specified range of ADC 150.

FIG. 4

Figure 4:
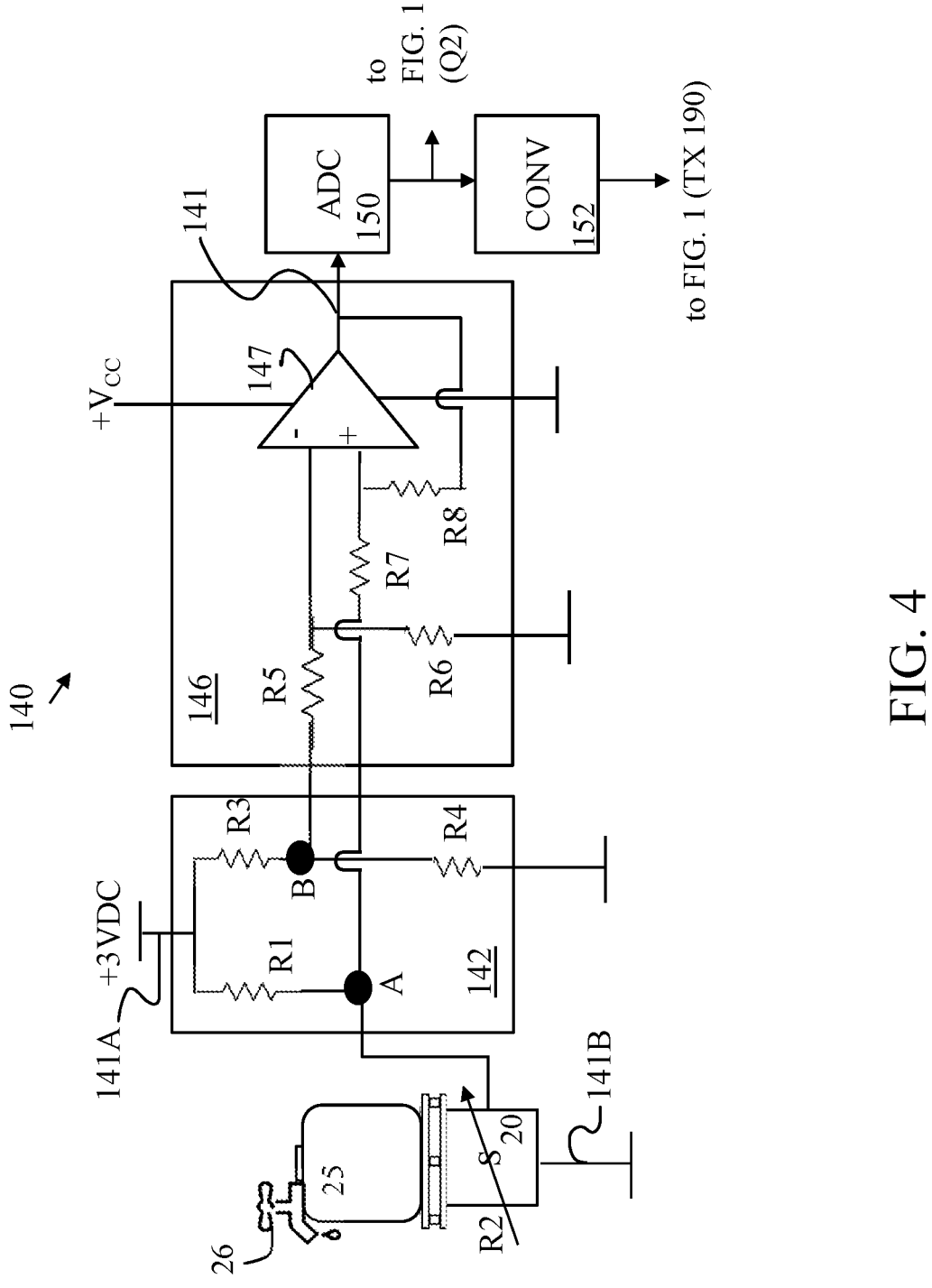
FIG. 4 is a schematic diagram of the sensor component shown in FIG. 3 including a load cell implementing the sensor element.

FIG. 4 is a schematic diagram of an example implementation of the sensor 140 shown in FIG. 3. In the example implementation of FIG. 4 sensor 140 may be a load cell and the process parameter may be a weight of a fluid container 25. The weight of fluid container 25 is a sum of the weight of container 25 itself, and the weight of any fluid contained within container 25. For example, in an example implementation, container 25 may contain water. When container 25 is filled to its maximum capacity with water, container 25 will have some maximum weight. When container 25 is empty, its weight will be some minimum weight, which will be the weight of the container itself.

In the example of FIG. 4, the fluid contained in container 25 is expendable by a process that consumes the fluid. For example, the water in container 25 may be consumed by extracting it via a spout 26 or other extraction mechanism. As the water is consumed, the weight of container 25 decreases. As the weight of container 25 decreases the resistance of load cell (R2) changes correspondingly. This change increasingly changes the balance of Wheatstone bridge circuit 142. As the balance of Wheatstone bridge circuit 142 changes, the magnitude of analog signal 141 at the output of operational amplifier 147 changes.

As described above with respect to FIG. 1, the output of sensor 140 is provided to ADC 150.

In the example of FIG. 4 the digital value at the output of ADC 150 represents the magnitude of a sample of analog signal 141. The digital value is provided to a unit converter circuit 152 as well as to digital quantizer 160 (best illustrated in FIG. 1). Unit converter circuit 152 is configured to convert the digital value that represents the magnitude of the sample, to a digital value that represents the weight of fluid container 25.

FIG. 5

Figure 5:
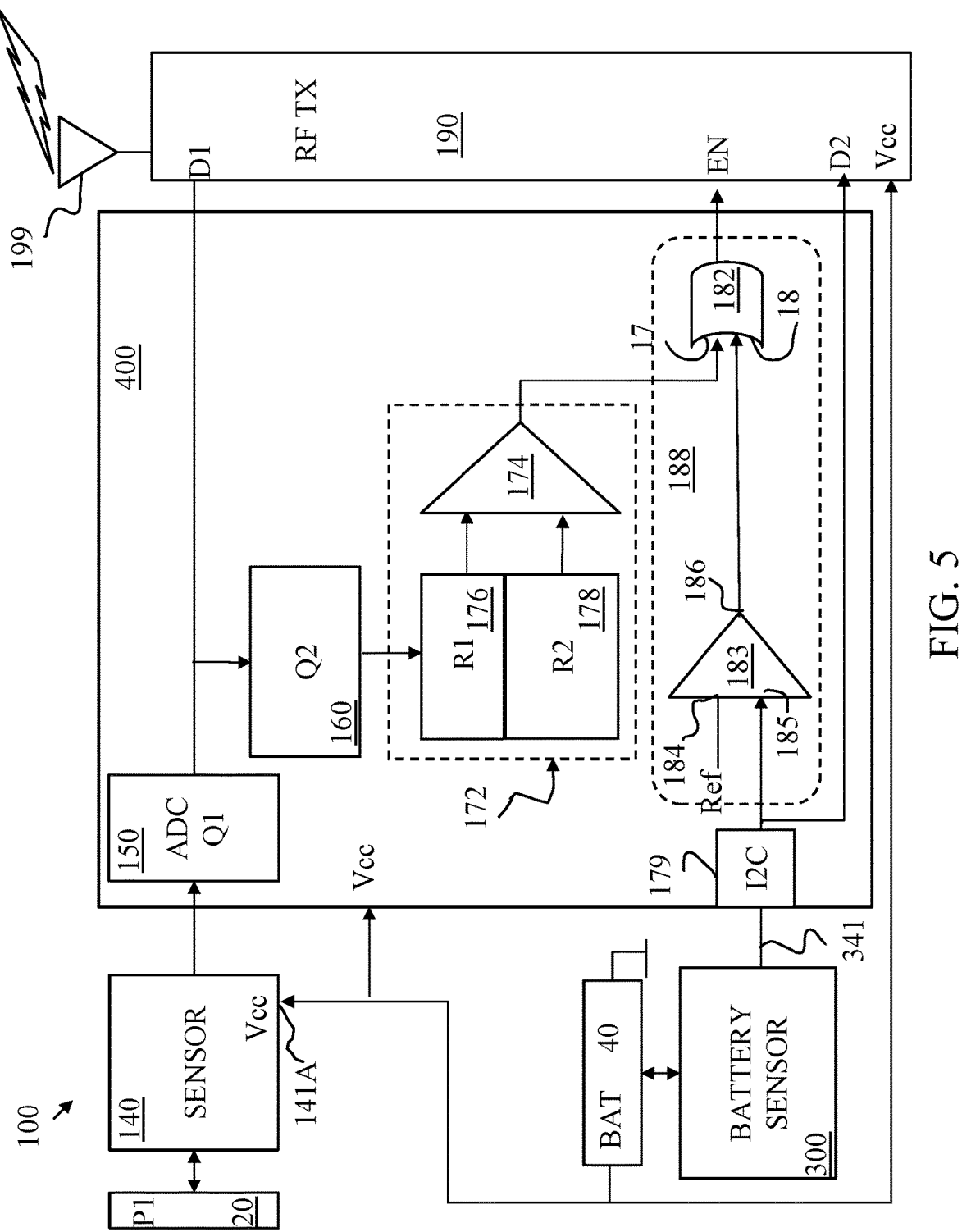
FIG. 5 is a block diagram of an example implementation of an adaptive, energy-efficient battery-operated wireless sensor including a battery sensor.

FIG. 5 is a block diagram of an example implementation of apparatus 100 as shown in FIGS. 1 and 3 further comprising a battery sensor 300. Battery sensor 300 is configured to periodically measure a parameter of battery 40 and to provide a battery parameter value 341 representing a measured value of a battery parameter. Examples of battery parameters measured by battery sensor 300 include: an amount of charge remaining on battery 40, an amount of charge on battery 40 available for use by sensor 140, processor 400 and/or transmitter 190, temperature of battery 40, elapsed time under load of battery 40, to name but a few.

In the example configuration of FIG. 5 apparatus 100 is configured operate transmitter 190 in a power efficient manner that adapts to changes in process 20 as well as to changes in state of battery 40.

In the example of FIG. 5 processor 400 further comprises a battery logic circuit 188. Battery sensor 300 is configured to provide a battery parameter value 341 conveying a parameter value related to a sensed state of battery 40. Battery sensor 300 communicates battery parameter value 341 to processor 400 via an FC (Inter-Integrated Circuit) input pin 179 of processor 400. Processor 400 applies battery parameter value 341 to data input D2 of transmitter 190.

Unlike the configuration of FIG. 1, in the configuration shown in FIG. 5 the output of detector circuit 172 is coupled to a first input 17 of an OR gate 182. Like the configuration of FIG. 1, comparator 178 will provide a '1' on its output only when detector circuit 172 detects R2 different than R1, i.e., detects a change in level from a first level to a different second level (see method of FIG. 2 described above).

In the case in which comparator 174 provides a '1' to OR gate 182, the output of OR gate 182 will also be '1' regardless of the state of the bit applied to second input 18 of OR gate 182. This '1' output from comparator 178 will enable transmitter 190 to transmit any digital value present at D1, and at the same time to transmit any value present on D2. Accordingly, in the configuration of FIG. 5 not all battery parameter values 341 provided by battery sensor 300 will be transmitted by transmitter 190. In the absence of any further configuration only those battery charge values on D2 that coincide with a change in level at the output of digital-to-digital quantizer 160 will be transmitted. In that manner, the battery life of battery 40 can be extended compared to the life of battery 40 would have if transmitter 190 transmitted more frequently than the configuration of FIG. 5 (or FIG. 1) permits.

In some situations, failure of apparatus 100 may have adverse consequences. For example, container 25 may contain a life sustaining resource such as water (or oxygen) to be consumed at a site in which no other source of that resource is readily available. In that case, it may be desirable to monitor the weight of fluid container 25. This may be done, e.g., via a local computer, consumer cellular device, or the like equipped to receive the digital value representing the weight as transmitted by transmitter 190. In that manner, a consumer monitoring the local device can detect a low water condition in container 25 and can make arrangements for refill of container 25 in advance of container 25 becoming empty. However, if battery 40 becomes drained of its charge, sensor 140 will cease to operate. In that case it may not be possible to determine the amount of fluid remaining in fluid container 25.

Accordingly, the configuration of FIG. 5 allows transmission of mission-significant battery states in the absence of a level change corresponding to a change in weight or other parameter sensed by sensor 140. To that end, processor 400 of FIG. 5 includes battery logic circuit 188. Battery logic circuit 188 comprises a comparator 183 configured with a reference input 184, a sensor input 185 and a logic output 186. Logic output 186 is provided to second input 18 of OR gate 182.

As noted above, battery sensor 300 is configured to provide a battery parameter value 341 to I²C pin 179 of processor 400. I²C is a standardized serial communication protocol that enables communication between integrated circuits (ICs) or electronic devices such as battery sensor 300 and processor 400. Processor 400 is configured to provide battery parameter value 341 received at I²C pin 179 to data input D2 of RF transmitter 190, as well as to sensor input 185 of comparator 183.

A reference voltage is applied to input 184 of comparator 183. The value of the reference voltage represents a threshold value of a parameter of battery 40, e.g., charge remaining on battery 40. In that example, the reference voltage value applied to reference input 184 can be set to represent a minimum threshold value. As long as battery parameter value 341 remains at or above the reference value at reference input 184, the logic output 186 of comparator 183 will be set to '0'. In that state, the output of comparator 174 will determine the state of transmitter 190 to transmit the values at D1 and D2.

However, the battery parameter value 341 falling below the reference value at reference input 184 will trigger the output of comparator 183 to change from '0' to '1', The '1' output will be applied to second input 18 of OR gate 182. As a result, the output of OR gate 182 will be '1' regardless of the value applied by comparator 178 to first input 17 of OR gate 182. The '1' at the output of OR gate 182 will enable transmitter 190 whereupon transmitter 190 will transmit the values at its D1 and D2 inputs. This configuration ensures transmitter 190 can transmit a mission-significant battery condition in the absence of detector circuit 172 detecting a level change. When the battery condition is not mission-significant, the level change technique can still be employed to conserve the life of battery 40.

FIG. 6

Figure 6:
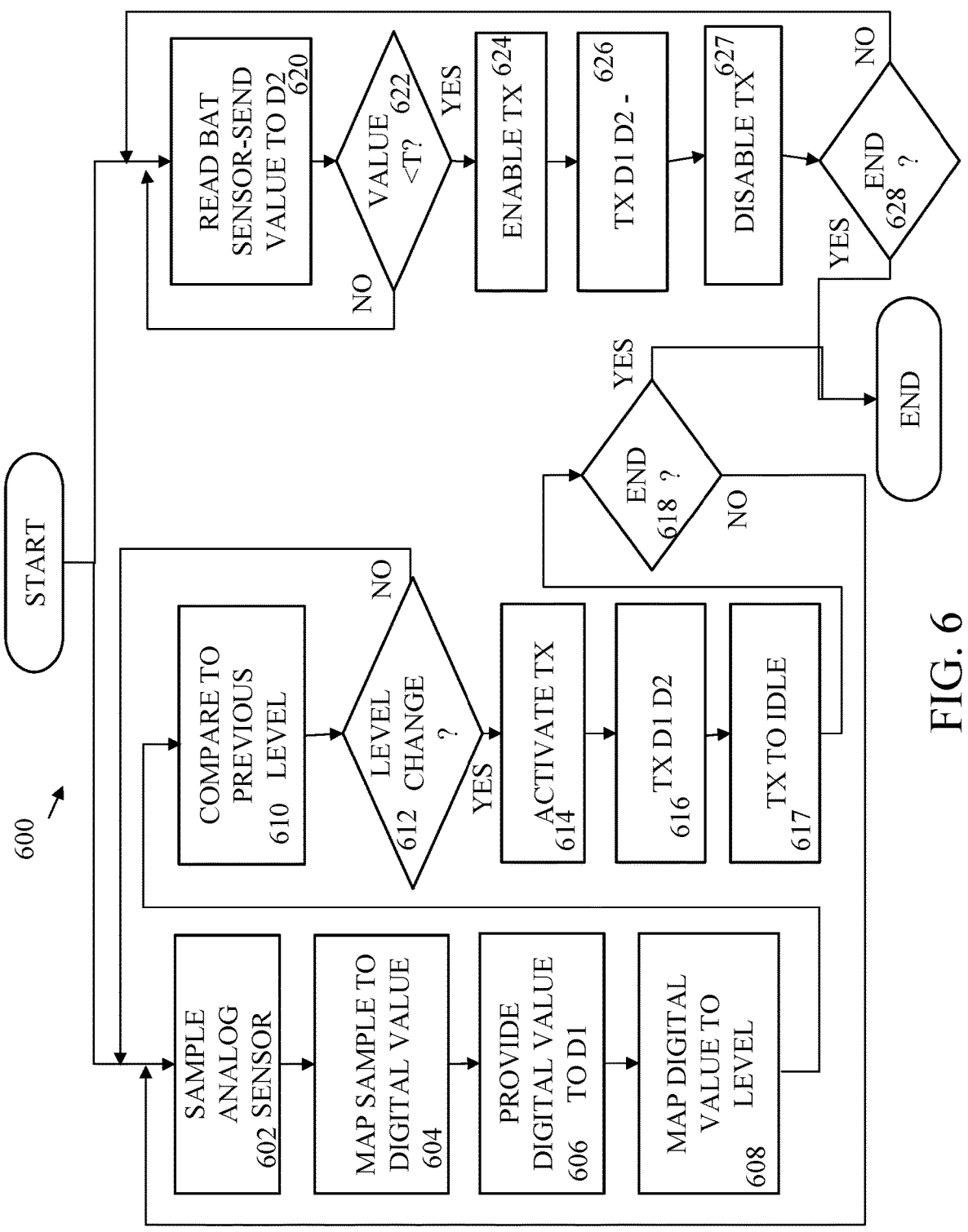
FIG. 6 is a flowchart of an example adaptive, energy-efficient method for conserving battery life in a battery-operated wireless sensor.

FIG. 6 is a flow chart of an example method 600 of controlling transmitter 190 in a power efficient manner that adapts to changes in process 20 as well as to changes in state of battery 40. In the example of FIG. 6 processor 400 may perform steps 602 to 618 (pertaining to process 20) in parallel with, or independently of steps 620 through 628 (pertaining to battery 40). To facilitate the description, steps 602 to 618 will be described first.

At step 602, ADC 150 obtains a first sample of analog signal 141 provided by sensor 140. At step 604 ADC 150 maps the first sample to a digital value in accordance with an ADC quantization scheme. At step 606 processor 400 provides the digital value to D1 of transmitter 190. At step 608 digital-to-digital quantizer 160 maps the digital value to a level in accordance with a digital quantization scheme.

At step 610 detector circuit 172 compares the level provided at step 608 in the present iteration of method 600 to the level provided at step 608 in the immediately preceding iteration of method 600. At step 612 based on the results of the comparison at step 610, processor 400 determines whether the level has changed. If not, the method returns to step 602 and repeats. If so, the method proceeds to step 614 to enable transmitter 190.

At step 616, in response to step 614, transmitter 190 transmits the values at D1 (for sensor 140) and D2 (for battery sensor 300). At step 617 processor 400 deactivates transmitter 190. At step 618 processor 400 determines if any process termination conditions are met. If so, the method ends. If not, the method returns to step 602 and repeats.

At step 620 processor 400 reads a battery parameter value provided by battery sensor 300 and provides the value to D2 of transmitter 190. At step 622 processor 400 determines whether the value is less than a predetermined threshold value T. If not, the method returns to step 620 to read the battery sensor and provide another value to at D2 of transmitter 190.

If the value obtained at step 620 is less than the threshold value T, processor 400 enables transmitter 190. At step 626, in response to enabling the transmitter at step 624, transmitter 190 transmits the values at D1 and D2. At step 627 processor 400 disables transmitter 190.

At step 628 processor 400 determines if any process termination conditions are met. If so, the method ends. If not, the method returns to step 620 and repeats.

FIG. 7

Figure 7:
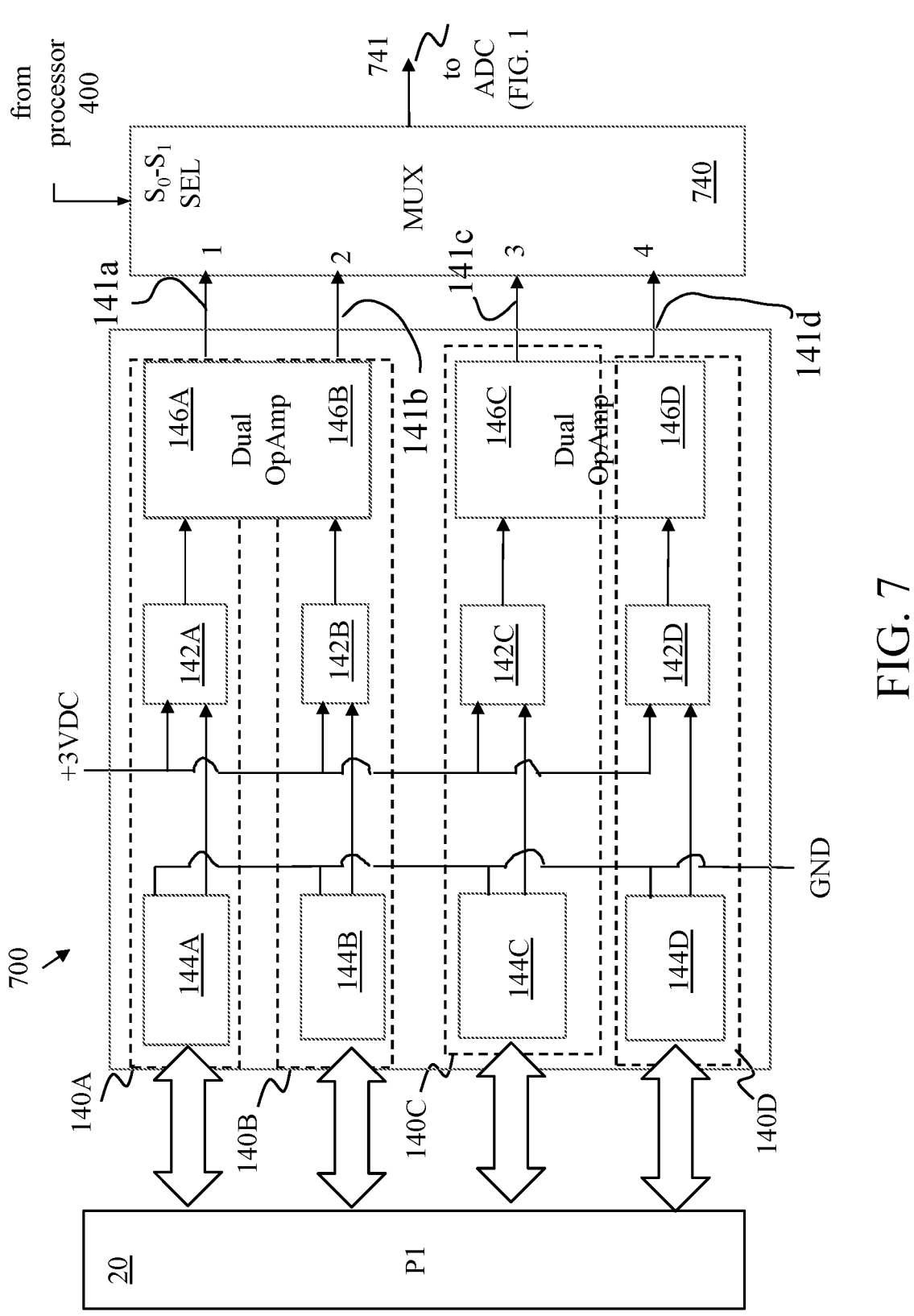
FIG. 7 is a schematic diagram of an example implementation of the sensor component of the adaptive, energy-efficient wireless sensor shown in FIG. 2.

FIG. 7 is an example implementation of a sensor system 700 comprising four sensors 140a, 140b, 140c and 140d. An example of sensor comprising sensor system 700, e.g., sensor 140a, is illustrated in detail in FIG. 3. Accordingly, sensor 140a comprises a sensor element 144a, a Wheatstone bridge circuit 142a and an operational amplifier circuit including an operational amplifier 146a. Sensor 140b comprises a sensor element 144b, a Wheatstone bridge circuit 142b and an operational amplifier circuit including an operational amplifier circuit 146b, and so on. In some example implementations operational amplifier pairs, e.g., 146a and 146b may be provided as a single integrated circuit 'Dual OpAmp'.

In the example implementation of FIG. 7, apparatus 100 further includes a multiplexer 740. Respective operational amplifier circuits 146a, 146b, 146c, 146d output corresponding analog signals 141a, 141b, 141c, 141d respectively, having amplitudes that change in accordance with changes in a parameter P1 of process 20 as sensed by corresponding respective sensor elements 144a, 144b, 144c, 144d. Respective analog signals 141a, 141b, 141c, 141d are provided to corresponding respective inputs 1, 2, 3, 4 of multiplexer 740.

Multiplexer 740 is operated by bits provided by processor 400 to the SEL (select) input of multiplexer 740. For example, processor 400 may provide the binary combination '00' to select input 1, '01' to select input 2, '10' to select input 3 and '111' to select input 4. With input 1 selected multiplexer 740 samples analog signal 141a and provides the sample at multiplexer output 741. The sample at multiplexer output 741 is provided in turn to ADC 150. Likewise, with input 2 selected, multiplexer 740 samples analog signal 141b and provides the sample at multiplexer output 741, which is then provided to ADC 150, and so on for multiplexer inputs 3 and 4.

FIG. 8

Figure 8:
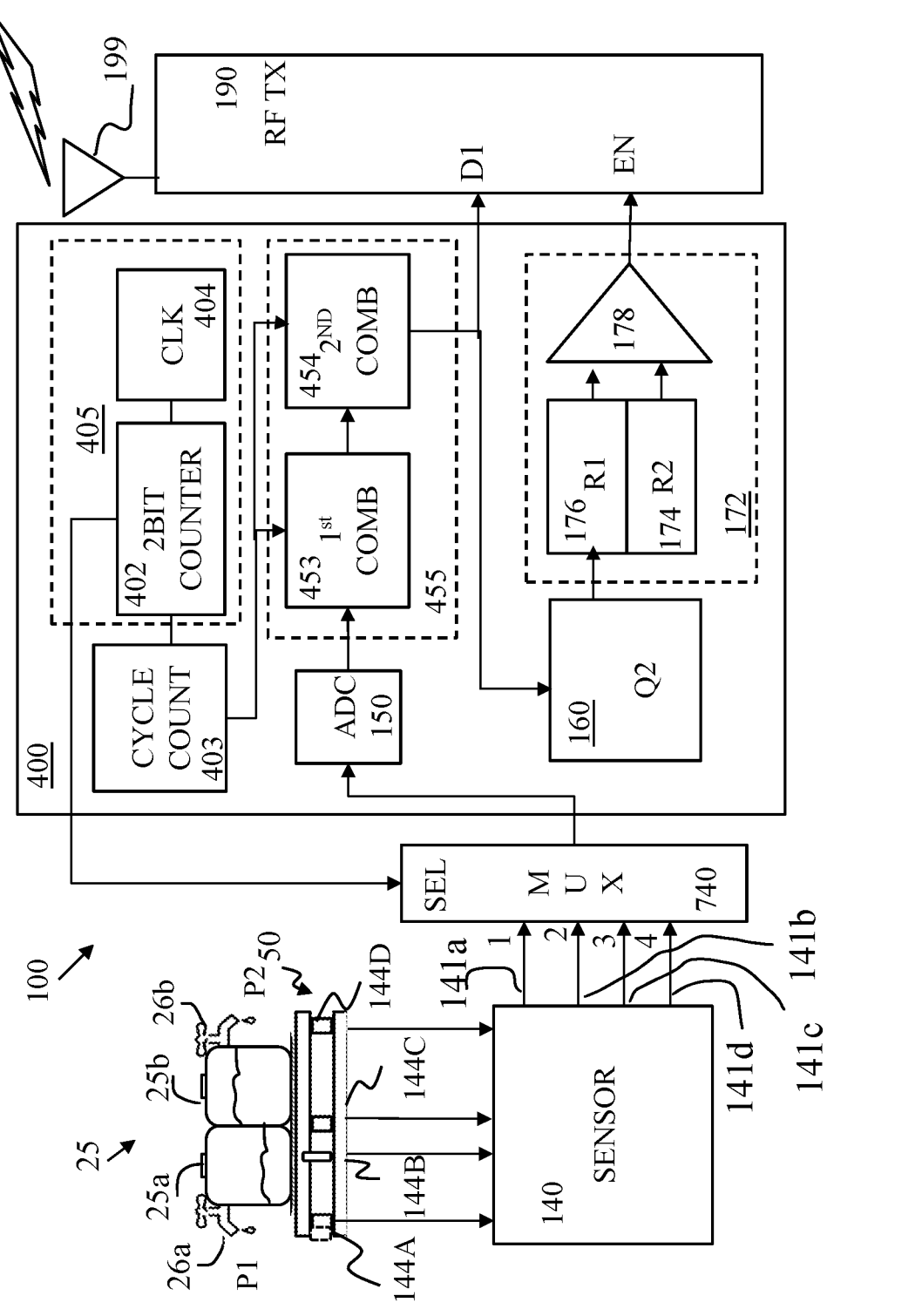
FIG. 8 is a block diagram of an example implementation of an adaptive, energy-efficient wireless sensor apparatus.

FIG. 8 is a block diagram showing an example implementation of apparatus 100 including sensor system 700 as shown in FIG. 7. In the example implementation of FIG. 8, sensor elements 144a, 144b, 144c, 144d comprise respective load cells disposed under or within a platform or other structure 50. Platform 50 may be formed to accommodate any application-specific shape and/or size suitable for the intended load. In the example of FIG. 8, the load comprises a dual-compartment fluid container 25. Container 25 comprises a first compartment 25a and a second compartment 25b. Both compartments may contain a fluid, e.g., water, that is consumed in a corresponding consumption process.

In the simplified example of FIG. 8, fluid in compartment 25a is consumed in a process P1 by which the is extracted, e.g., via a spout 26a. Likewise, compartment 25b contains a fluid consumed in a process P2 by which the fluid is extracted, e.g., via spout 26b. In this example a load sensed by the load cells of platform 50 may be unevenly distributed. For example, compartments 25a and 25b may exert the same force on platform 50 when empty. However, in use compartment 25a does not necessarily contain the same amount of fluid as that contained in compartment 25b. Process P1 may consume fluid at a higher, or lower rate than that of process P2. Accordingly, the force exerted by compartment 25a on platform 50 can differ from the force exerted by compartment 25b on platform 50.

Sensor elements 144a, 144b, 144c, 144d are implemented by four respective load cells disposed under or within platform 50 and distributed to implement platform 50 comprising a multi-point weighing system 50. In multi-point weighing system 50, load cells (sensor elements) 144a, 144b, 144c, 144d can provide accurate readings for an unevenly distributed load by sensing the force applied at their respective different points on platform 50. In this implementation, sensor 140 includes respective load cells (sensor elements) 144a, 144b, 144c, 144d providing corresponding respective analog signals 141a, 141b, 141c, 141d. Respective amplitudes of corresponding analog signals 141a, 141b, 141c, 141d vary in accordance with variations in force sensed by their corresponding respective load cells 144a, 144b, 144c, 144d at their corresponding respective points on platform 50. Analog signals 141a, 141b, 141c, 141d are applied to corresponding multiplexer inputs 1, 2, 3, 4 respectively.

In the example implementation of apparatus 100 illustrated in FIG. 8, processor 400 further comprises a selector circuit 405 coupled to the SEL input of multiplexer 740, a cycle counter 403, and an arithmetic and logic circuit (ALC) 455. Selector circuit 405 includes a two-bit counter 402 driven by a clock 404. ALC 455 includes a first combiner circuit 453 and a second combiner circuit 454.

Selector circuit 405 of processor 400 is configured to select, in sequence, input 1, 2, 3, 4 respectively to obtain corresponding samples of analog signals 141a, 141b, 141c, 141d respectively. For example, a two-bit counter 402 is configured to count from 00 to 11, advancing at each tick of clock 404 (or some multiple thereof) and returning to 00 in repeating cycles. During a cycle, selector circuit 405 obtains respective samples of corresponding respective analog signals 141a, 141b, 141c, 141d and provides the four samples respectively to ADC 150.

Cycle counter 403 is configured to count cycle repetitions of two-bit counter 402 up to a preset maximum number of cycles. When the present number of cycles is reached, cycle counter 403 resets and starts the count again.

ADC 150 maps the respective samples of analog signals 141a, 141b, 141c, 141d to corresponding respective digital values in accordance with an ADC quantization scheme Q1. An example ADC quantization scheme is described in detail above and will not be repeated here in the interest of brevity. In a given cycle, ADC 150 provides the four corresponding respective digital values to a first combiner circuit 453. For the given cycle, first combiner circuit 453 combines the four digital values to provide a first combination result. For the given cycle, first combiner circuit 453 provides the first combination result to a buffer of second combiner circuit 454.

The manner in which first combiner circuit 453 combines the four digital values provided by ADC 150 in a cycle, may be as simple as taking an average of the four digital values. In other implementations the manner of combination may be more complex, e.g., to take into account different force values for different load cells of platform 50, where the load may be unevenly distributed on platform 50. In any case, a first combination result is a digital value that accurately represents the total force exerted on platform 50 by container 25 at the time of obtaining the four corresponding samples.

First combiner circuit 453 repeats the combining and buffering operations until the maximum count of cycle counter 403 is reached. At that time the number of first combination digital values buffered in in second combiner circuit 454 is equal to the maximum count of cycle counter 403. Further, when the maximum count of cycle counter 403 is reached, second combiner circuit 454 combines the first combination digital values stored in its buffers and provides a second combination result to the D1 input of transmitter 190 and also to digital-to-digital quantizer 160.

The sample cycle repeats at a period determined by clock 404. Once per repetition, first combiner circuit 453 provides a digital value that represents the total force as some combination of the forces experienced by respective load cells of platform 50.

ALC 455 provides a digital value representing the result of the combination to input D1 of transmitter 190 and to digital quantizer 160.

For respective cycles of two-bit counter 402 ALC 455 provides corresponding respective digital values to digital quantizer 160. As described in detail herein above, digital quantizer 160 maps respective digital values to corresponding respective levels and provides the corresponding levels respectively to detector circuit 172. The functioning of detector circuit 172 and its cooperation with transmitter 190 is described in detail above and will not be repeated here for the sake of brevity.

As will be appreciated from the example of FIG. 8, apparatus 100 is configured to control transmitter 190 in an energy efficient manner that adapts to changes in non linear processes such as P1 and P1. For example, fluid in either container compartment of container 25 may be consumed relatively rapidly during some time periods, not consumed during other time periods. Either or both of compartments 25a, 25b may be allowed to drain completely, and they may be refilled at any time. Process P1 and P2 may have different consumption characteristics.

FIG. 9

Figure 9:
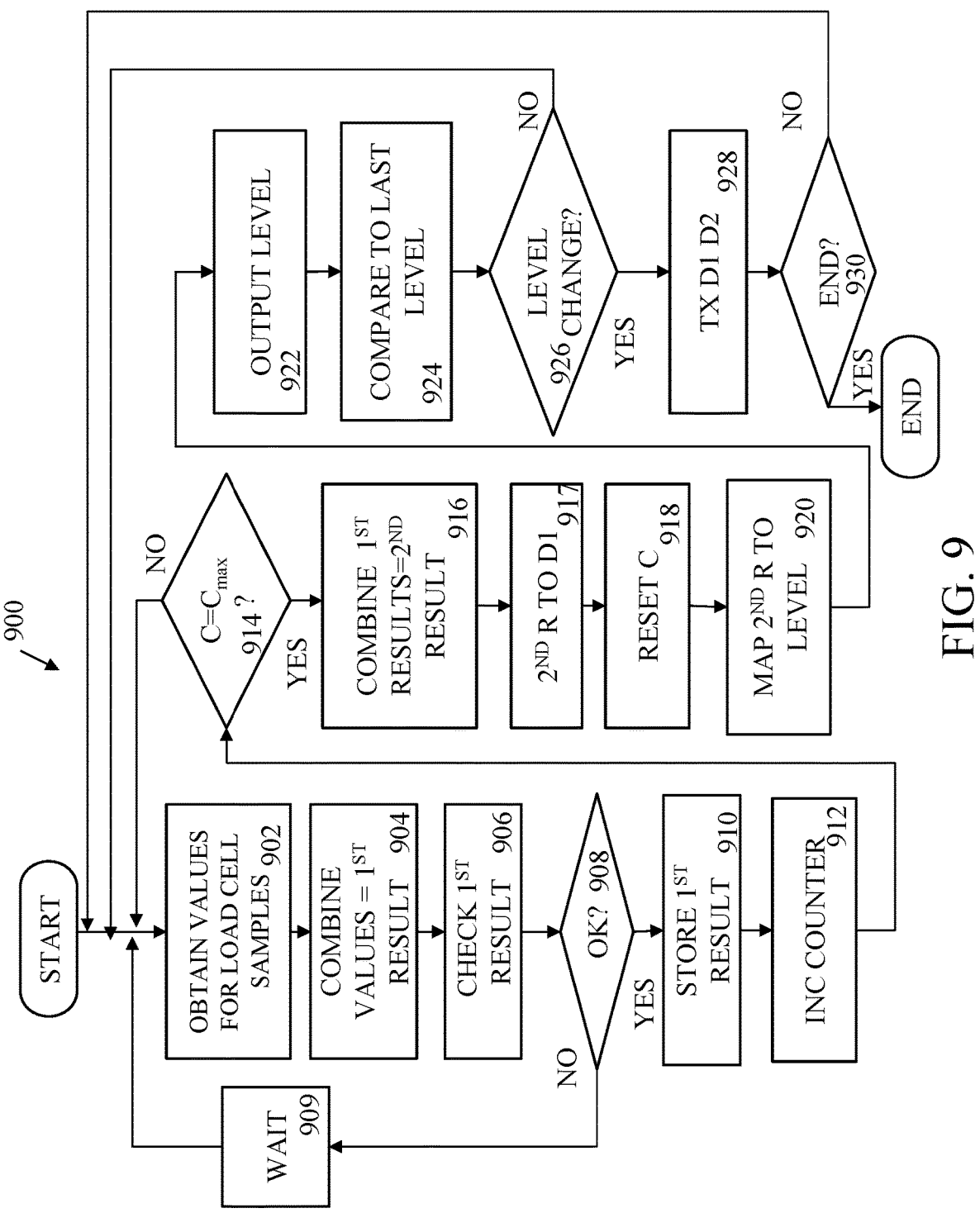
FIG. 9 is a flowchart of an example adaptive, energy-efficient method for controlling a transmitter in a wireless sensor apparatus.

FIG. 9 is a flowchart of an example method 900 for adaptive power efficient control of a sensor transmitter. At step 902 processor 400 provides respective ADC output digital values for corresponding respective load cells and buffers the values in $1^{st}$ combiner. At step 904 first combiner combines the digital values to provide a first combiner result.

At step 906 processor 400 checks the first combiner result. For example, processor 400 may check whether the first combiner result is a non-zero value. A first combiner result having a zero value could signify a malfunction in multi-point weighing system 50. If the first combiner result does not pass the check at 908, processor 400 proceeds to step 909 to wait for a predetermined time, or for a predetermined number of cycles of cycle counter 403, then proceeds to step 902 to repeat method 900. If the first combiner result passes the check at 908, processor 400 proceeds to step 910 where the first result is stored in a buffer of second combiner circuit 454.

At step 912 cycle counter 403 increments. At step 914 processor 400 determines whether the count in cycle counter 403 has reached the preset maximum count. If not, the method returns to step 902 and repeats steps 902 to 914 until the cycle counter reaches its maximum count and the determination at step 914 is 'yes'. When the determination at step 914 is 'yes', at 917 processor 400 provides the second combination result to D1 of transmitter 190.

At step 918 processor 400 resets cycle counter 403. At step 920 digital quantizer 160 maps the second combination result to a corresponding level. At step 922 digital quantizer 160 provides the corresponding level to detector. At 924 detector compares the corresponding level to the previously mapped level. At step 926 detector compares the previously mapped level to the corresponding level to evaluate whether the levels are the same. If not, the method returns to 902 and repeats. If so, transmitter 190 transmits the data at its data inputs. At step 930 processor 400 determines if an end condition is met. If not, the method returns to step 902 and repeats. If so, the method ends.

The above discussion is meant to be illustrative of the principles and various embodiments of the disclosed subject matter. Numerous variations and modifications will become apparent to those skilled in the art once the above disclosure is fully appreciated. It is intended that the following claims be interpreted to embrace all such variations and modifications unless explicitly excluded.

The invention claimed is:

1. An apparatus comprising:
   a sensor configured to provide an analog signal having a magnitude that varies in accordance with variations in a sensed process parameter;
   an analog to digital converter (ADC) configured to map a first sample of the analog signal to a first digital value, and a second sample of the analog signal to a second digital value according to an ADC quantization scheme;
   a digital quantizer configured to map the first digital value to a first level and the second digital value to a second level according to a digital quantization scheme; and
   a radio frequency (RF) transmitter configured to activate to transmit the second digital value in response to receiving a signal indicating the second level differs from the first level.

2. The apparatus of claim 1 wherein the sensor comprises a load cell and the magnitude of the analog signal varies in accordance with variations in a force exerted on the load cell by a fluid-bearing container.

3. The apparatus of claim 2 further comprising a unit converter configured to convert the first digital value to a first weight of the fluid-bearing container and the second digital value to a second weight of the fluid-bearing container, wherein the RF transmitter is activated to transmit the second weight in response to receiving a signal indicating the second level differs from the first level.

4. The apparatus of claim 3 wherein the digital quantization scheme configures the apparatus to adapt an activation rate of the RF transmitter in accordance with changes in relative magnitudes of the analog signal from sample to sample.

5. The apparatus of claim 4 wherein the digital quantization scheme configures the apparatus to control the RF transmitter to have a relatively low activation rate when the magnitude of the analog signal varies little from sample to sample, and a relatively high activation rate when the magnitude of the analog signal varies greatly from sample to sample thereby operating the transmitter in a power-efficient manner without limiting transmission range of the transmitter.

6. The apparatus of claim 5 wherein the transmitter has an activation rate that varies in accordance with variations in a rate of consumption of fluid in the fluid-bearing container.

7. The apparatus of claim 6 wherein the transmitter has an activation rate determined at least in part by a magnitude of a difference between the second weight and the first weight.

8. The apparatus of claim 7 wherein the sensor, the ADC, the digital quantizer and the transmitter are configured to receive operating power from a battery.

9. The apparatus of claim 8 including a battery sensor coupled to the battery and configured to provide a battery parameter value to the transmitter, wherein the transmitter is configured to transmit the second digital value and the battery parameter value in response to detecting the second level different from the first level.

10. The apparatus of claim 9 wherein the transmitter is configured to transmit the second digital value and the battery parameter value in response to detecting the battery parameter value below a threshold value.

11. The apparatus of claim 10 wherein the sensor, the ADC, the digital quantizer and the transmitter comprise a processor and the apparatus further comprises a memory storing processor-executable instructions that configure the processor to:

compare the battery parameter value to a threshold value; and detect one of: the battery parameter value at or above the threshold value, and the battery parameter value below the threshold value.

12. The apparatus of claim 11 wherein the processor is further configured to:

in response to the battery parameter value at or above the threshold value, activate the transmitter to transmit the battery parameter value in response to detecting the second level differs from the first level; and in response to the battery parameter value below the threshold value, transmit the battery parameter value.

13. The apparatus of claim 12 further comprising a detector circuit including:

a first register configured to store the first level;

a second register configured to store the second level; and a comparator configured to compare the first register to the second register and provide a comparator output indicating one of: the second level differs from the first level, and the second level equal to the first level.

14. The apparatus of claim 13 wherein the RF transmitter changes from an active state to an inactive state in response to the detector circuit detecting the second level equal to the first level.

15. The apparatus of claim 14 wherein the digital quantization scheme is defined by a number of levels, and the activation rate of the transmitter is determined at least in part by the number of levels and at least in part by the rate of consumption.

16. A method comprising:

obtaining a first sample and at least a second sample of an analog signal whose magnitude varies over time in accordance with variations over time in a process parameter;

mapping the magnitude of the first sample to a first digital value, and the magnitude of the second sample to a second digital value in accordance with an ADC quantization scheme;

mapping the first digital value to a first level, and the second digital value to a second level in accordance with a digital quantization scheme; and activating a transmitter to transmit the second digital value in response to detecting the second level different from the first level.

17. The method of claim 16 further comprising:

storing the first level in a first register;

storing the second level in a second register;

comparing the first register to the second register to detect one of: the second level not equal to the first level, and the second level equal to the first level;

in response to detecting the second level not equal to the first level, enabling the transmitter to transmit the second digital value; and in response to detecting the second level equal to the first level, maintaining the transmitter in an idle state.

18. The method of claim 17 further comprising:

mapping the magnitude of the first sample to the first digital value and the magnitude of the second sample to the second digital value in accordance with an ADC quantization scheme; and mapping the first digital value to the first level and the second digital value to the second level in accordance with a digital quantization scheme.

19. A method of operating a transmitter of a battery-powered wireless sensor apparatus comprising:

placing the transmitter in an idle state;

sampling an analog signal provided by a sensor to provide at least first and second respective measurements of a magnitude of the analog signal;

mapping the first and second respective measurements to corresponding, respective first and second digital values;

mapping the respective first and second digital values to corresponding respective first and second quantization levels;

in response to detecting the second quantization level different from the first quantization level:

activating the transmitter;

transmitting the second digital value;

returning the transmitter to the idle state; and in response to detecting the second quantization level the same as the first quantization level, maintaining the transmitter in the idle state.

* * * * *